(12) United States Patent
Fricke

(10) Patent No.: US 7,006,284 B2
(45) Date of Patent: Feb. 28, 2006

(54) APPARATUS FOR VIEWING AND ANALYZING ULTRAVIOLET BEAMS

(76) Inventor: William C. Fricke, 9 Jessie St., New Fairfield, CT (US) 06812

( * ) Notice: Subject to any disclaimer, the term of this patent is extended or adjusted under 35 U.S.C. 154(b) by 17 days.

(21) Appl. No.: 10/847,548

(22) Filed: May 17, 2004

(65) Prior Publication Data

US 2005/0254122 A1 Nov. 17, 2005

(51) Int. Cl.
*G02B 13/14* (2006.01)
*G01J 1/58* (2006.01)

(52) U.S. Cl. ............... 359/355; 359/326; 359/350; 359/642; 250/372

(58) Field of Classification Search ........ 359/326–332, 359/350–361, 642, 709–719; 250/372, 484.2
See application file for complete search history.

(56) References Cited

U.S. PATENT DOCUMENTS

| 4,835,088 A | * | 5/1989 | Gilson ..................... 430/323 |
| 5,631,767 A | * | 5/1997 | Dodge et al. ............... 359/328 |
| 5,864,207 A | * | 1/1999 | Kume et al. ................ 313/533 |
| 5,939,709 A | * | 8/1999 | Ghislain et al. ............ 250/216 |
| 6,730,915 B1 | * | 5/2004 | Fricke et al. ............... 250/372 |

* cited by examiner

*Primary Examiner*—Thong Q Nguyen
(74) *Attorney, Agent, or Firm*—Bachman & LaPointe, PC

(57) ABSTRACT

An imaging apparatus for DUV beams is provided which includes a lens for receiving a DUV beam and producing an image of the DUV beam, wherein the lens has an aplanatic surface and a hemispheric surface, and wherein at least the aplanatic surface is made from or otherwise has a down-converting medium for producing a down-converted beam; an image sensing member for viewing an image of the down-converted beam; and optics for relaying the image of the down-converted beam from the lens to the image sensing member. A processor can be communicated with the image sensing member for analyzing the image of the DUV beam.

7 Claims, 1 Drawing Sheet

APPARATUS FOR VIEWING AND ANALYZING ULTRAVIOLET BEAMS

BACKGROUND OF THE INVENTION

The invention relates to an apparatus for viewing and analyzing high spatial resolution structure in ultraviolet (UV, DUV and EUV) beams.

Microlithography and nano-fabrication technologies rely on ultraviolet laser beams for fabricating structures with features only a few tens of nanometers in size. Fabricating such structures requires beams and masks with sub micron sized features. Paramount in constructing beam delivery systems for manufacturing nano structures is the ability to view and quantify the physical dimensions of sub micron features of the beam at the work surface.

There are no known devices for in-situ imaging of high resolution DUV beams in real time.

It is the object of the present invention to provide an economical apparatus for in-situ viewing and quantification of high resolution DUV beam patterns in real time.

Other objects and advantages of the present invention will be presented below.

SUMMARY OF THE INVENTION

In accordance with the present invention, the foregoing objects and advantages have been readily obtained.

The invention is a high resolution imaging system, which comprises a medium for down-converting the DUV beam into a visible image and suitable optics or other means for relaying the visible image to an imaging sensor or screen for viewing and analysis.

According to the invention, an imaging apparatus for DUV beams is provided which comprises a lens for receiving a DUV beam and producing an image of the DUV beam, wherein the lens has an aplanatic surface and a hemispheric surface, and wherein at least the aplanatic surface comprises a down-converting medium for producing a down-converted beam; an image sensing member for viewing an image of the down-converted beam; and optics for relaying the image of the down-converted beam from the lens to the image sensing member.

A processor can advantageously be communicated with the image sensing member for analyzing the image as desired.

BRIEF DESCRIPTION OF THE DRAWINGS

A detailed description of preferred embodiments of the present invention follows, with reference to the attached drawings, wherein.

DETAILED DESCRIPTION

Figure 1:
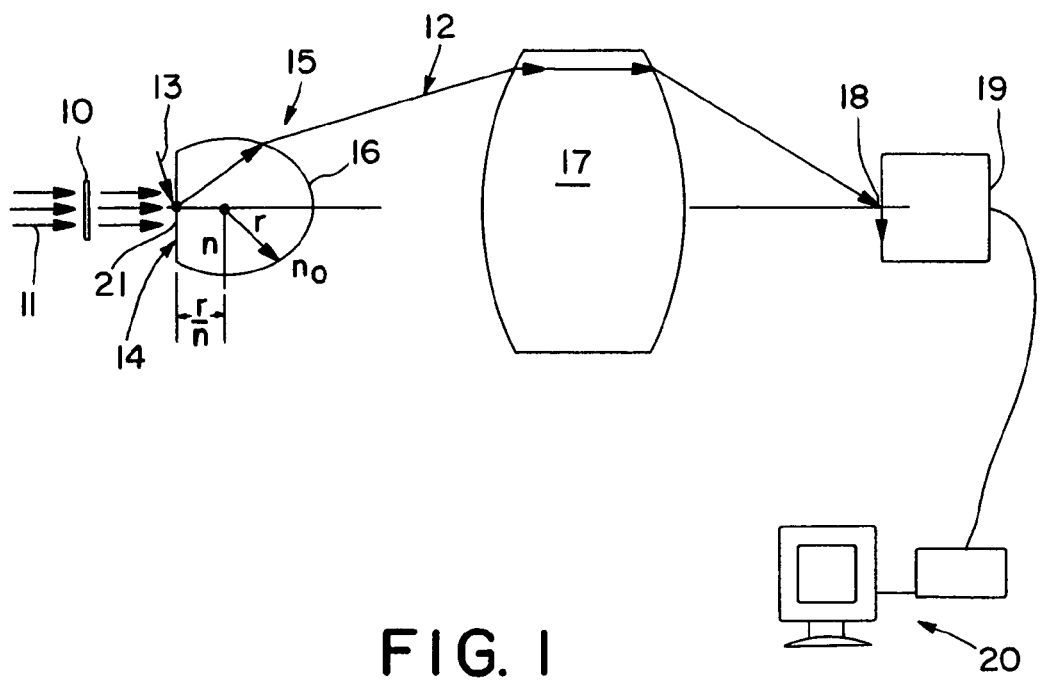
FIG. 1 schematically illustrates an apparatus in accordance with the present invention.

The invention relates to an apparatus which accurately and reliably images high resolution ultraviolet (UV), deep ultraviolet (DUV) and extreme ultraviolet (EUV) beams without performance degradation due to long-term exposure to the DUV. The term "DUV beams" herein collectively refers to any UV, DUV or EUV source.

In accordance with the present invention, the DUV beam is down-converted to longer wavelength radiation. Down conversion (the down-conversion process is hereinafter referred to as D-C) is the process whereby light of one wavelength (e.g., UV, DUV, EUV radiation) is converted to light at a longer wavelength using a medium referred to as a down-converter. The down-converted, longer wavelength light (e.g., visible, near-IR, etc.) is herein collectively referred to as "visible" light. The down-converter medium must be carefully chosen to produce an accurate spatial distribution and intensity distribution "copy" of the DUV beam.

The "visible" light is relayed using suitable optics to an imaging sensor or screen for viewing and analysis.

The down-converter is comprised of a suitable medium. As will be further described below, the D-C medium can be provided in the form of a disk; a layer deposited on a substrate or, an entire optical element made of a D-C medium. Disks and layers of D-C medium on a substrate are substantially contained in prior disclosures.

In a preferred embodiment, the optical element is an Amici lens made from a D-C medium. An Amici lens has unique properties that can be advantageously used for the present invention. An Amici lens is an aplanatic hyper-hemispherical lens, which produces a magnified virtual image of an object located at the aplanatic point. The virtual image can then be relayed using suitable optics to form a real image of high magnification with few aberrations. The image is free of all orders of spherical aberration, third order coma, and third order astigmatism. It can be further shown that if the aplanatic point is a distance $d=(r/n)$ from the center of the sphere of radius, r, then a virtual image of the object will be produced a distance $d'=r \times n$ from the center of the sphere. The magnification of the Amici lens (the ratio of the height of the virtual image to the height of the object at the aplanatic point) is $(n/n_o)^2$, where n is the index of refraction of the lens medium and $n_o$ is the index of refraction of the surrounding medium, e.g., air. High numerical apertures (NA) are possible using this technique ($NA = n \sin\square$, where $\square$ is the angle of ray propagation from the optical axis inside the medium surrounding the object). Since the limiting spatial resolution of an optical system is $[0.61\square/NA]$, the advantage of this technique for viewing DUV beams is significant. Limiting spatial resolution is defined as the distance between two point sources such that the first minimum of the Airy diffraction pattern of one source in the focal plane of a lens of numerical aperture NA lies at the location of the peak of the Airy distribution of the other source.

FIG. 1 schematically illustrates the apparatus in accordance with the present invention. A high-resolution DUV pattern can be imparted to the DUV beam by passing the DUV beam 11 through a mask 10 containing the pattern. The high resolution pattern in the DUV beam at the aplanatic point 13 of aplanatic surface 21 is an accurate representation of the features of the mask. The down converting medium 14 which in this embodiment is also the medium used to make the Amici lens 15, converts the high resolution DUV pattern into a high resolution "visible" pattern. The hyper-hemispherical surface 16 of the Amici lens redirects a portion of the "visible" light 12 to relay optics 17, producing a "visible" image of the DUV beam 18. The "visible" image of the DUV beam can be viewed with an imaging sensor array, such as a CCD camera, or with a screen 19. A computer 20 or other suitable processor can capture and analyze images from the CCD camera or other suitable device, typically using image analysis software which is well known to persons of ordinary skill in the art.

It should be noted that the general structure of an Amici lens, relay optics, imaging sensors and image analysis software are all devices which themselves are well known to a person of ordinary skill in the art. Thus, further disclosure in connection with each of these individual components is not presented herein.

Figure 2A:
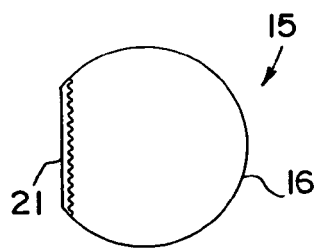
FIG. 2a illustrates an Amici lens made entirely from D-C medium.

FIG. 2a illustrates an Amici lens 15 in accordance with a preferred embodiment of the invention, wherein the entire lens is made of D-C material. In this embodiment, and advantageously, down-conversion is carried out entirely within the lens itself.

Figure 2B:
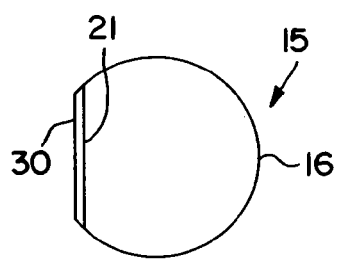
FIG. 2b illustrates an Amici lens having a disk of D-C medium optically coupled to the aplanatic surface.

FIG. 2b illustrates an alternative embodiment wherein lens 15 can be provided from any suitable optical element material, and wherein the D-C medium is provided in the form of a disk 30 of D-C medium material, wherein the disk is optically coupled with the aplanatic surface 21. In this case the disk is positioned over the aplanatic surface.

Figure 2C:
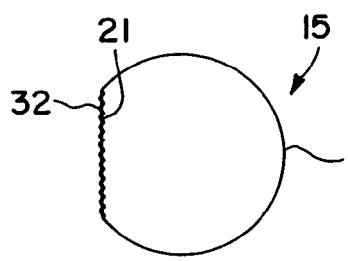
FIG. 2c illustrates an Amici lens having a layer of D-C medium deposited on the aplanatic surface.

FIG. 2c show a further embodiment of the invention wherein lens 15 can be provided from any suitable optical element material and wherein the D/C medium is deposited in a layer 32 on the aplanatic surface 21 of the lens.

It should be noted that the Amici lens referred to herein has been shown having a hyper-hemispherical surface, that is, a surface which is spherical through more than 180 degrees. It is within the broad scope of the present invention to utilize a lens wherein the spherical portion is hemispherical, or even slightly less than hemispherical, and these configurations, along with preferred hyper-hemispherical surfaces, are considered to be included within the term hemispherical as used herein.

Suitable D-C medium material is well known to a person of ordinary skill in the art. Examples of acceptable materials include, but are not limited to rare earth doped materials, such as CE:YAG, and the like.

This apparatus can advantageously be used in numerous industrial, medical and like procedures wherein high resolution images of DUV beams are required for material processing.

Specific examples of various applications wherein the apparatus of the present invention can find useful application include microlithography, micromachining, and the like.

It is to be understood that the invention is not limited to the illustrations described and shown herein, which are deemed to be merely illustrative of the best modes of carrying out the invention, and which are susceptible to modification of form, size, arrangement of parts and details of operation. The invention rather is intended to encompass all such modifications, which are within its spirit and scope as defined by the claims.

What is claimed is:

1. An imaging apparatus for DUV beams, comprising:
   a lens for receiving a DUV beam and producing an image of the DUV beam, wherein the lens has an aplanatic surface and a hemispheric surface, and wherein at least the aplanatic surface comprises a down-converting medium for producing a down-converted beam;
   an image sensing member for viewing an image of the down-converted beam; and
   optics for relaying the image of the down-converted beam from the lens to the image sensing member.

2. The imaging apparatus of claim 1, further comprising a processor communicated with the image sensing member for analyzing the image of the DUV beam.

3. The imaging apparatus of claim 1, wherein the lens is made of the down-converting medium such that the down converted beam is created by and within the lens.

4. The imaging apparatus of claim 1, wherein the hemispheric surface of the lens is a hyper hemispheric surface.

5. The imaging apparatus of claim 1, wherein the down-conversion medium comprises a disk of down-conversion material optically coupled to the aplanatic surface of the lens.

6. The imaging apparatus of claim 1, wherein the down-conversion medium comprises a layer of down-conversion material deposited on the aplanatic surface of the lens.

7. The imaging apparatus of claim 1, wherein the lens is an Amici lens.

* * * * *